United States Patent [19]

Kitano et al.

[11] Patent Number: 5,194,935
[45] Date of Patent: Mar. 16, 1993

[54] PLASTIC ENCAPSULATED SEMICONDUCTOR DEVICE AND STRUCTURE FOR MOUNTING THE SAME DEVICES HAVING PARTICULAR RADIATING FIN STRUCTURE

[75] Inventors: Makoto Kitano, Tsuchiura; Asao Nishimura, Ushiku; Akihiro Yaguchi; Nae Yoneda, both of Ibaraki; Ryuji Kohno, Ibaraki; Sueo Kawai, Ibaraki; Gen Murakami, Tama; Ichio Shimizu, Gunma, all of Japan

[73] Assignee: Hitachi, Ltd., Tokyo, Japan

[21] Appl. No.: 647,416

[22] Filed: Jan. 29, 1991

[30] Foreign Application Priority Data

Jan. 29, 1990 [JP] Japan ................................. 2-16027

[51] Int. Cl.[5] .................... H01L 23/30; H01L 23/34; H01L 23/36
[52] U.S. Cl. .................................... 257/706; 257/722
[58] Field of Search ...................... 357/81, 82, 72, 75

[56] References Cited

U.S. PATENT DOCUMENTS

| 3,548,927 | 12/1970 | Spurling | 357/81 |
| 4,369,838 | 1/1983 | Asanuma et al. | 357/81 |
| 4,878,106 | 10/1989 | Sachs | 357/75 |
| 4,899,210 | 2/1990 | Lorenzetti et al. | 357/81 |

FOREIGN PATENT DOCUMENTS

| 55-105354 | 8/1980 | Japan. | |
| 56-129350 | 10/1981 | Japan. | |
| 60-63952 | 4/1985 | Japan. | |
| 61-104553 | 7/1986 | Japan. | |
| 62-81735 | 4/1987 | Japan. | |
| 63-31541 | 3/1988 | Japan. | |
| 63-84958 | 6/1988 | Japan. | |
| 2-224263 | 9/1990 | Japan | 357/81 |

Primary Examiner—Rolf Hille
Assistant Examiner—S. V. Clark
Attorney, Agent, or Firm—Antonelli, Terry Stout & Kraus

[57] ABSTRACT

The plastic encapsulated semiconductor device according to the present invention has a semiconductor chip, leads, and members for electrically connecting these parts to each other. A part of leads, the semiconductor chip and the connecting members are encapsulated with a plastic to form a package. The plate type plastic fins formed on the surface of and integrally with the package are divided in two directions perpendicular to each other thereby forming, for example, rows and columns of fins or fin segments, on the package surface. Therefore, the semiconductor device according to the present invention can be molded easily by a transfer molding. It has a high reliability with respect to the prevention of cracks in the plastic, and a low thermal resistance, and is most suitably used to obtain a high-density package mounting structure.

29 Claims, 7 Drawing Sheets

PLASTIC ENCAPSULATED SEMICONDUCTOR DEVICE AND STRUCTURE FOR MOUNTING THE SAME DEVICES HAVING PARTICULAR RADIATING FIN STRUCTURE

BACKGROUND OF THE INVENTION

1. Field of the Invention

This invention relates to a plastic encapsulated semiconductor device and a structure for mounting the same devices, and more particularly to a plastic encapsulated semiconductor device suitable for the reduction of the thermal resistances of devices of this kind, and a structure mounted with such devices.

2. Description of the Prior Art

The most popular means for reducing the thermal resistance of a plastic encapsulated semiconductor device is a method of fixing metallic radiation fins to a package with a bonding agent as disclosed in Japanese Patent Laid-Open Nos. 105354/1980 and 63952/1985. Although according to this method there can be the performance of fins, it has problems concerning the reliability of the bonded surfaces of the fins and the productivity of fin-bonded packages.

As to methods of providing a package with plastic fins formed integrally with a package body as means for solving these problems, the following are exemplary: Japanese Patent Laid-Open Nos. 129350/1981 and 81735/1987 and Japanese Utility Model Laid-Open Nos. 104553/1986 and 84958/1988.

A method of providing a package surface with a plurality of projections and recesses for the purpose of increasing the heat-transferring area of the package surface and thereby reducing the thermal resistance thereof is disclosed in Japanese Utility Model Laid-Open No. 31541/1988.

Out of these conventional techniques, the method of bonding fins to a package has a problem concerning the reliability of the fin-bonded surfaces as already mentioned. In general, the coefficient of linear expansion of a fin material (mainly a metal) and that of a plastic with which a package is encapsulated are different. This causes thermal stress to occur in the layer of bonding agent, and this layer is therefore liable to break.

In the production of surface mounting type packages the demand for which has increased in recent years, a package body is heated to not lower than 200° C. when the leads and the substrate are soldered to each other. At such a high temperature, the strength of a bonding agent decreases considerably, so that it is even more difficult to secure the reliability of the product. In a package of such construction, the number of parts and manufacturing steps required increase, and the productivity thereof decreases.

The techniques for providing a package with plastic fins formed integrally with a package body, for eliminating the drawbacks of the above-mentioned techniques, are known as described before. A structure having such plastic fins is inferior in the cooling performance relative to a structure using metallic fins. However, the former structure does not lower the above-mentioned reliability of the product since it does not have a layer of bonding agent. It also has a high productivity since the number of manufacturing steps does not increase. However, packages of this construction have not yet been used practically. The reasons reside in the following two fatal drawbacks of the packages.

Figure 11:
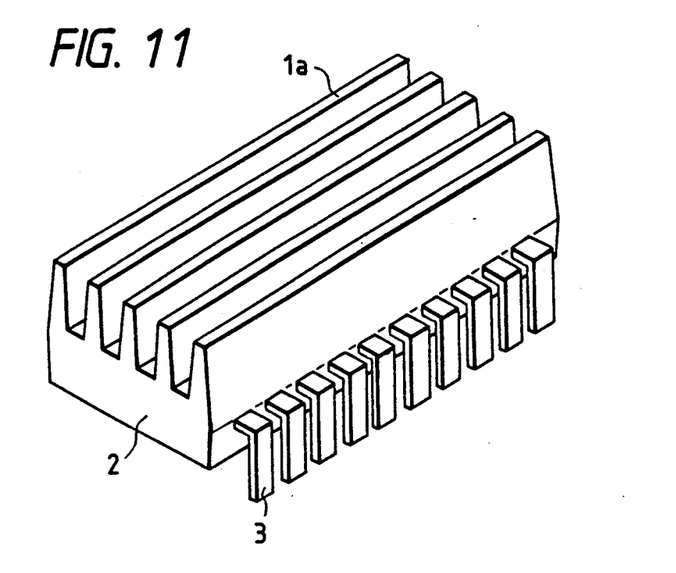
FIG. 11 is a perspective view of a conventional plastic encapsulated semiconductor device.

A perspective of a conventional plate type plastic fin-carrying package is shown in FIG. 11. Leads 3 are extended outwardly from side surfaces of a package body 2, and plastic fins 1a are provided on the upper surface thereof. It is very difficult to form a package of such a shape by a generally-used transfer molding.

Figure 12:
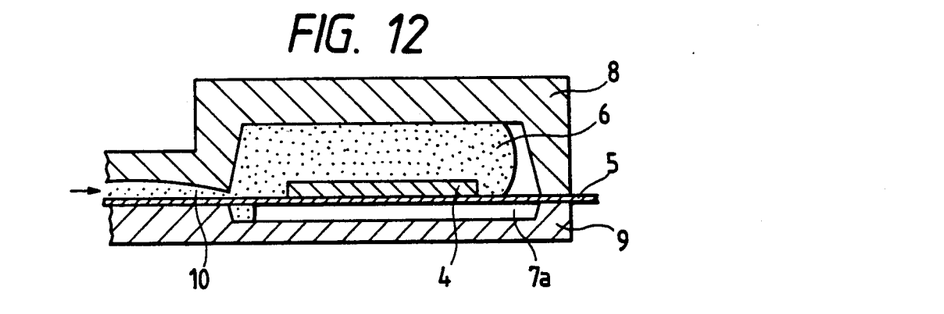
FIGS. 12 and 13 are sectional views showing a process for transfer-molding the conventional package of FIG. 11.

The flow of a plastic in a transfer molding of a conventional construction will be described with reference to FIG. 12. FIG. 12 shows in longitudinal section including fins the flow of a plastic during the transfer molding of a package. A lead frame 5 mounted with a chip 4 is inserted between metal molds 8, 9, and a molten plastic 6 is injected through a gate 10 on the left-hand side. Since a flow passage on the lower side of the lead frame 5 is much narrower than that on the upper side thereof, it has a high resistance, and the molten plastic does not smoothly flow therein. As a result, the plastic 6 flows only in the passage on the upper side of the lead frame, and an unfilled space 7a remains on the lower side of the lead frame.

Figure 13:
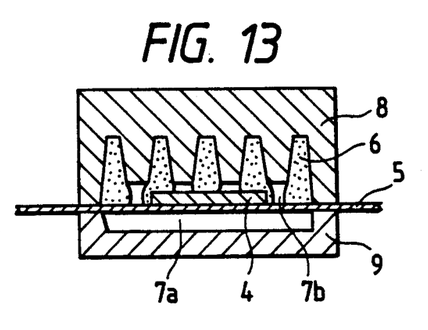

FIG. 13 is a cross sectional view where the section is perpendicular to that of FIG. 12. Since the plastic 6 flows only into the wider passages of the fin side, the unfilled space 7a remains in the portions having a high flow passage resistance.

Figure 14:
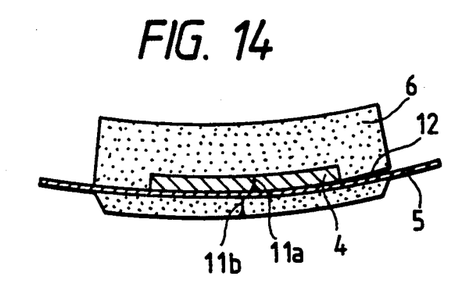
FIG. 14 is a sectional view showing a failure mode of the conventional package of FIG. 11.

Even if the filling of plastic by a transfer molding is done perfectly during the production of such a conventional structure, various defects are liable to occur in the package. FIG. 14 is a longitudinal cross sectional view of a package including fins which is formed after the completion of the molding step. The coefficient of linear expansion of the plastic 6 is higher than that of the chip 4, and shrinkage occurs in the plastic 6 during the curing process. In the structure shown in FIG. 14, in which the upper and lower portions are unbalanced, the fins shrink greatly to cause curvature as shown in the drawing. Since bending stress occurs in the lower surfaces of the chip 4 and package during this time, cracks 11a, 11b readily occur therein. A delaminated portion 12 is also apt to occur in the interface between the plastic 6 and lead frame 5.

In a package provided with cylindrical fins as disclosed in Japanese Utility Model Laid-Open Nos. 104553/1986 and 84958/1988, a plastic does not smoothly flow into the cylindrical portions, and unfilled spaces remain in these portions, so that it is difficult to form cylindrical fins.

In order to eliminate the drawbacks of the packages with fins according to the conventional techniques described above, the height of the fins must be reduced. However, the reduction of the height of fins causes a great decrease of the radiation effect of the fins, and makes it difficult to attain the prime object of reducing the thermal resistance of the package.

When only projections and recesses are provided in the surface of a package as shown in Japanese Utility Model Laid-Open No. 31541/1988, the air does not flow into the recesses. Therefore, these portions become nearly adiabatic, and the thermal resistance-reducing effect of the package is small.

An described above, in a conventional package having plastic fins formed integrally therewith, consideration is not satisfactorily given to the productivity and reliability of the product.

SUMMARY OF THE INVENTION

An object of the present invention is to provide a plastic encapsulated semiconductor device having high productivity and reliability and a large thermal resistance reducing effect, and a structure mounted with such semiconductor devices.

This object is achieved by dividing plate type plastic fins, which are formed on the surface of and integrally with a package, at the locations along two parallel lines perpendicular to the longitudinal center line of the package surface.

A plastic encapsulated semiconductor device is provided with a semiconductor chip, a lead frame, and a member for electrically connecting these parts, in which a part of the lead frame, semiconductor chip and connecting member are encapsulated with a plastic to form a package.

A plastic encapsulated semiconductor device according to a first example (embodiment) of this invention is provided with a plurality of plastic fins on at least one surface (ordinarily the back surface; the same applies to the following) of the package, and is characterized in that these fins are arranged in a plurality of files and ranks so that the lengthwise axes of the fins, corresponding to the direction of the longitudinal center line of the package surface, become parallel to one another.

A plastic encapsulated semiconductor device according to a second example (embodiment) of this invention is provided with projections, the material of which consists of the plastic with which the semiconductor chip is encapsulated, on at least one surface of the package, and is characterized in that these fins are divided suitably in two directions perpendicular to each other on the package center surface to form a plurality of files and ranks of fins, the maximum length of which is set larger than two times that of a maximum thickness thereof.

A plastic encapsulated semiconductor device according to a third invention example (embodiment) of this invention is characterized in that a plurality of fins are arranged in a staggered manner on at least one surface of the package.

The preferred modes of these semiconductor devices are as follows.

(1) Each fin is tapered as it extends in a direction outward from the package surface, and an angle between a side surface of each fin and the package surface is set to be obtuse between not less than 95° and not more than 105°.

(2) The root portion of a side surface of each fin (the portion at which a side surface of a fin and the portion of the package surface from which the fin extends intersect each other) is curved.

(3) Each fin is streamlined (wing-shaped) in section so that one end of the fin in a sectional view, which is taken along a plane parallel to the package surface, is round and the other end is in the shape of a blade edge.

(4) The ratio of the distance between the portions of the fins which are at a level of ½ of the height thereof to the thickness of the portion of each fin which is in the same level is not less than 1 and not more than 2.

(5) The material used as the plastic encapsulant and of the fins is a plastic having a heat conductivity of not lower than 1.0 W/m° C.

(6) A mark is put on the package surface or upper ends of the fins.

(7) These modes (1)-(6) are appropriately combined.

A structure mounted with plastic encapsulated semiconductor devices according to the present invention is characterized in that each of the plurality of plastic encapsulated semiconductor devices has a plurality of fins mounted on a respective one of two substrate, these device-mounting substrates being arranged in an opposed state so that the fins of the devices on different substrates face one another. It is preferable that the distance between the free ends of the opposed fins is not more than three times that of the distance between the portions of adjacent fins which are at a level of ½ of the height of a fin. It is, of course, desirable to mount the substrates with plastic encapsulated semiconductor devices of any of the above-mentioned modes.

If the plate type plastic fins are divided in two directions, spaces in which fins do not exist occur even in the direction in which a plastic flows in the hollow portion on the upper side of a lead frame during the transfer molding of a package. Therefore, these fin-absent spaced constitute a flow passage resistance, and the flow passage resistance in the hollows on the upper and lower sides of the lead frame becomes balanced, so that the plastic flows also in the hollow on the lower side of the lead frame. The plastic is also filled in the space among the fins on the upper side of the lead frame.

In the structure according to the present invention, the upper and lower unbalanced portions of the interior of a mold are divided into parts the number of which is in agreement with that into which the fins are divided. Accordingly, even when the plastic shrinks after the completion of a molding step, the undesirable curvature of the package as a whole, shown in FIG. 14, does not occur. Therefore, the plastic and chip do not crack, and the plastic does not delaminate from lead frame.

The plastic encapsulated semiconductor device according to the present invention is provided with plate type plastic fins formed integrally with a package body and divided at locations along two parallel lines perpendicular to the longitudinal center line of the package surface. The longitudinal center line corresponds to a direction parallel to the elongated end sides of the package body, the elongated end sides being formed with the leads extending substantially perpendicularly outwardly therefrom. This enables the package to be molded easily by a transfer molding method, the reliability of the package with respect to the prevention of occurrence of cracks in the plastic to be increased, the thermal resistance of the package to be reduced, and the package to be applicable to the high-density mounting.

The above and other objects as well as advantageous features of the invention will become apparent from the following description of the preferred embodiments taken in conjunction with the accompanying drawings.

PREFERRED EMBODIMENTS OF THE INVENTION

The embodiments of the present invention will now be described with reference to the drawings.

Figure 1:
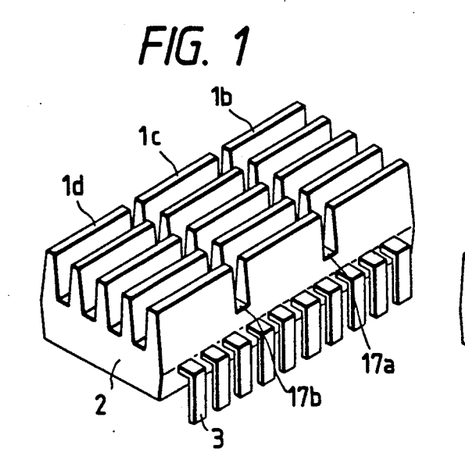
FIG. 1 is a perspective view of a first embodiment of the plastic encapsulated semiconductor device according to the present invention.

A perspective view of a first embodiment of the package according to the present invention is shown in FIG. 1. A chip (not shown) and leads 3 are electrically connected, and the resultant product is then plastic encapsulated in a transfer mold to form a package body 2 and plastic fins. In this embodiment, the plastic fins are disposed as five lines (rows of fins), each of which is divided into three blocks (groups or columns) 1b, 1c, 1d, and two portions (package surfaces) 17a,17b having no fins existing therebetween thereby defining the blocks (group or columns) of fins (or fin segments).

Figure 2:
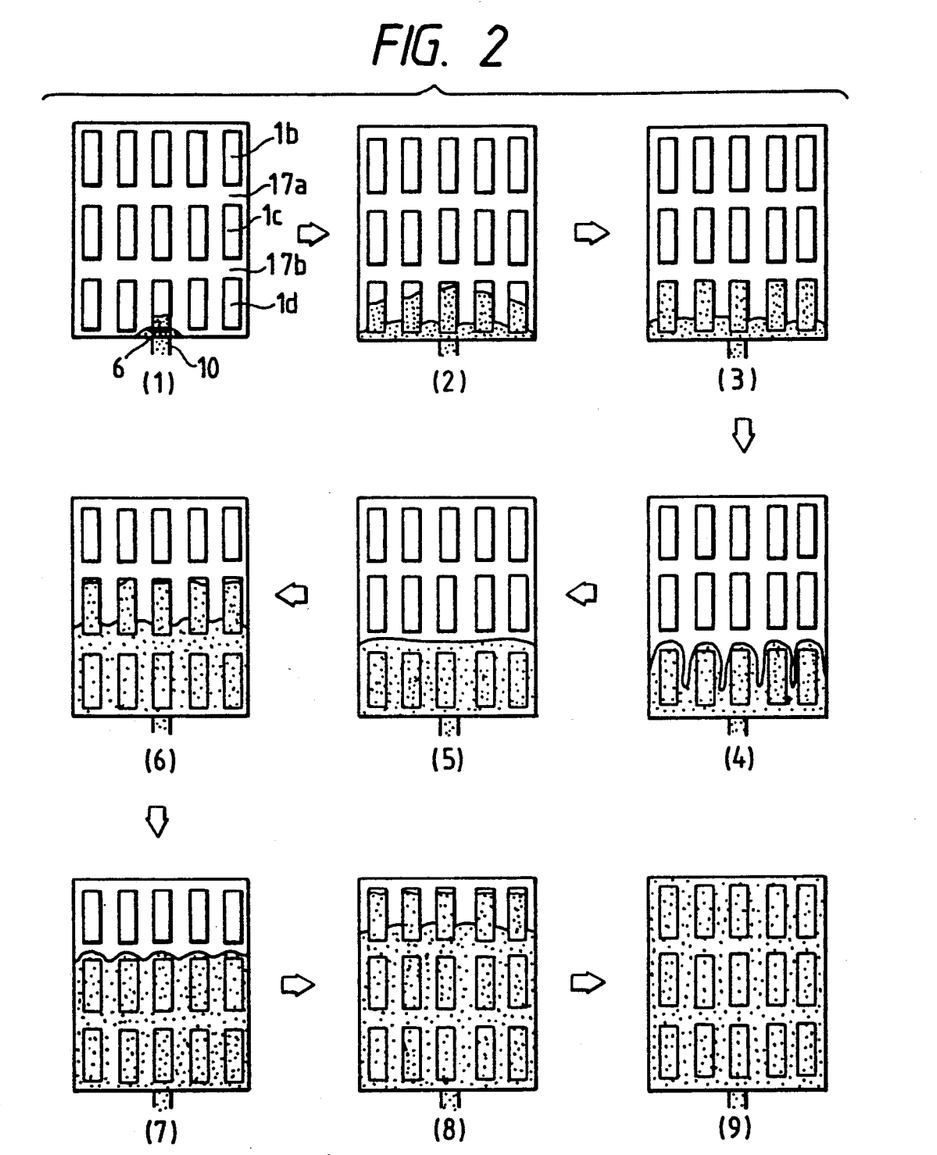
FIG. 2 is a process diagram showing the flow of a plastic during the transfer molding of the plastic encapsulated semiconductor device of FIG. 1.

FIG. 2 is a schematic plan showing the flow of a plastic during the transfer-molding process of a package of the embodiment, in which the flow of plastic proceeds in accordance with the illustrated steps of from (1) to (9) with the lapse of time. (1) shows the state immediately after the starting of the molding, in which the plastic 6 flows into a mold through a gate 10. This plastic flows as it spreads in the shape of a fan. Since the flow passages in which fins 1d are to be formed are wide, the passage resistance is low, so that the plastic flows into these passages selectively as shown in (2), these passages being filled therewith first as shown in (3). However, there is a portion 17b located between the blocks (column) of fins 1d and 1c, in which fins are not to be formed, and in which the flow passage resistance of portion 17b is high due to the small height thereof. As a result therefore the plastic starts flowing in the spaces for the fins of the second block 1c as shown in (4), the plastic also flowing into the space on the lower side, which corresponds to the back side of the surface of FIG. 2, of the lead frame. After the spaces among the fins has been filled completely with the plastic (the state shown in (5)), the plastic flows selectively through the passages corresponding to the fins 1c (the state shown in (6)). Such actions are made repeatedly to enable the package as a whole to be sealed completely without leaving any portions unfilled as shown in (9) through the stages (6), (7), (8).

When the ratio of the length in the direction where the plastic flows, of the passage in which a fin is to be formed to the thickness of the passage is lower than 2, the cross section of the resultant fin becomes nearly a square. The inventors of the present invention have ascertained that, in a fin-forming passage having such a cross-sectional shape, plastic does not flow up to the end thereof. Consequently, it is necessary that the ratio of the length of the fin to the thickness thereof be set greater than 2. If preparations are made for the production of a package of such construction, plastic can be molded perfectly without leaving any spaces unfilled.

In the embodiment shown in FIG. 1, the fins are divided so as to form three lengthwise-spaced blocks (columns) of fins (or fin segments). Therefore, the force generated due to the shrinkage of the plastic is not transmitted between the divided portions, so that the warp of the package becomes very small. Accordingly, the occurrence of cracks shown in FIG. 14 in the plastic and chip can be prevented.

In this embodiment, the side surfaces (or end sides) of each fin are not perpendicular to the package surface; they are tapered so that the fins become thin toward the ends thereof. If the fins are formed in this manner, they can be withdrawn from a metal transfer mold easily after they have been formed in the mold. The angle between a side surface of a fin and the package surface is required to be at least 95°, and not higher than 105°. This knowledge has been obtained from the past experiments of molding techniques. If this angle is set too large, the cross-sectional area of the outermost end portion of a fin decreases, and the operation efficiency of the fin is lowered. Therefore, this angle is desirably not lower than 95° and not higher than 105°. If not only the side surfaces of a fin but also the front and rear surfaces thereof are inclined at this angle, the productivity is improved, though setting the front and rear surfaces to this angle is not shown in this embodiment. Forming the fins in this manner is necessary to inject a plastic reliably into the fin-forming passages.

Figure 3:
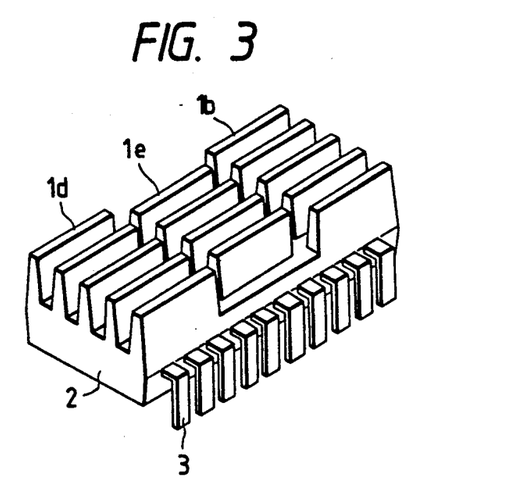
FIG. 3 is a perspective view of a second embodiment of the plastic encapsulated semiconductor device according to the present invention.

A perspective view of a second embodiment of the package according to the present invention is shown in FIG. 3. Leads 3 are provided on the side surfaces of a package body 2, and plastic fins are molded integrally with the package body 2 on the upper surface thereof. The fins are divided into three blocks (group or columns) 1b, 1e, 1d. In this embodiment, the fins are arranged in a staggered manner, that is, there is formed an arrangement of fins (fin segments) between adjacent blocks (groups or columns) that are in parallel which can be described as effecting an alignment pattern of the fins (fin segments) of all the blocks that is zig-zag.

Since the fins are arranged in this manner, the air flowing along the side surfaces of the fins 1d becomes hotter, passes through the central portions of the spaces among the fins 1e, while, conversely, the air flowing in the central portions of the spaces among the fins 1d does not become as hot and passes along the side surfaces of the fins 1e. Thus, the heat is radiated uniformly into the air in this embodiment. This enables the radiation efficiency to be improved, and the thermal resistance to be reduced to a level lower than that in the first embodiment.

Figure 4:
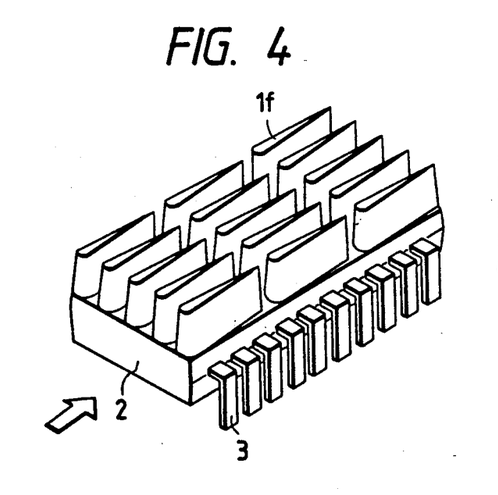
FIG. 4 is a perspective view of a third embodiment of the plastic encapsulated semiconductor device according to the present invention.

A perspective view of a third embodiment of the package according to the present invention is shown in FIG. 4. In the package of this embodiment, the air is introduced from the left lower portion of the drawing to the upper right portion thereof (in the direction of the arrow). In this embodiment, the fins 1f are divided into three blocks (columns) in the same manner as in the above-described first and second embodiments, and each fin (or fin segment) is streamlined, that is, the front end of the upstream side thereof is rounded, and the rear end of the downstream side is like a blade (sword) edge. If the fins are made in such a shape, the fluid resistance thereof decreases, so that the air can flow easily among the fins. This enables the thermal resistance to be lowered.

Although forming an object in the shape of a wing so as to reduce the fluid resistance thereof has heretofore been known well in other technical fields, this method has not been employed in the manufacture of radiation fins of a conventional plastic encapsulated semiconductor device, because forming metallic fins in this manner causes a great decrease of the productivity.

According to the present invention, fins are molded integrally with a package body. Therefore, the productivity does not vary at all independent of the shape of the fins. Fins of a special shape like that of this embodiment can also be obtained easily.

If fins arranged in a staggered manner described in the second embodiment are applied to the third embodiment, the thermal resistance can be further reduced.

Figure 5:
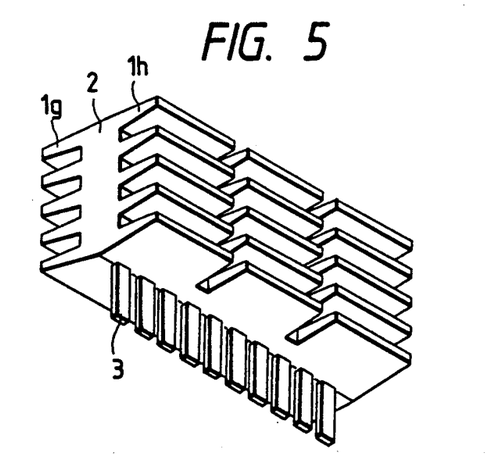
FIG. 5 is a perspective view of a fourth embodiment of the plastic encapsulated semiconductor device according to the present invention.

A perspective view of a fourth embodiment of the package according to the present invention is shown in FIG. 5. In this embodiment, three-divided fins (or three columns of fins) 1g, 1h are provided on two surfaces of a package body 2. Since the package is thus formed, the heat generated in the chip radiates efficiently from the two surfaces of the package to enable the thermal resistance to decrease markedly. This embodiment is effective only for a package to be mounted in a perpendicularly standing state on a substrate (for example, a zigzag in-line package), that in the respective columns (rows) extend perpendicular to a surface of a substrate on which it is mounted on. If this embodiment is applied to a package to be mounted on a substrate in parallel with the surface thereof, the fins on one side of the package body would be positioned between the package body and substrate, and the air would not flow smoothly, so that a good effect cannot be obtained.

Figure 6:
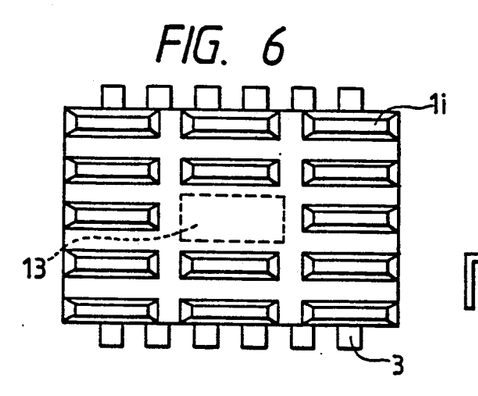
FIG. 6 is a plan view of a fifth embodiment of the plastic encapsulated semiconductor device according to the present invention.

A plan view of a fifth embodiment of the package according to the present invention is shown in FIG. 6. In this embodiment, part of the fins 1i is removed to provide a flat portion on the package surface, and marks, such as a trademark and a product number are put thereon. A reference numeral 13 denotes the marking area. If the package is formed in this manner, the radiation efficiency slightly decreases, but marking similar to that on conventional packages can be done. The marking may also be done on a flat portion provided on the portion of the package surface which is between adjacent fins without using the method in this embodiment of removing part of the fins. The free end of a fin may also be flattened to put a mark on the resultant end surface.

Figure 7:
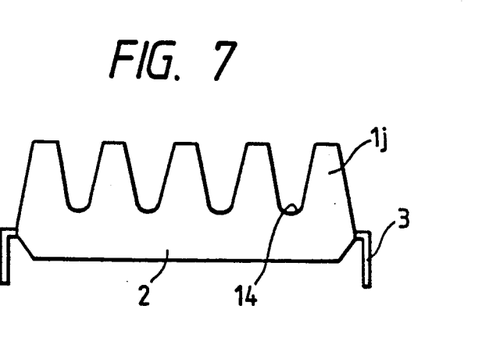
FIG. 7 is a side elevation of a sixth embodiment of the plastic encapsulated semiconductor device according to the present invention.

A side elevation of a sixth embodiment of the package according to the present invention is shown in FIG. 7. In this embodiment, a smoothly curved surface is formed on the portion of a package body 2 at which a side surface of a fin 1j and the surface of the package body 2 intersect each other. Stress concentration is liable to occur in the portion of a conventional package at which a side surface of a fin and the package surface intersect each other more abruptly, and cracks would occur in such a portion due to the shrinkage of the plastic. If the intersecting portion is provided with a smoothly curved surface as in this embodiment, stress concentration decreases, so that the occurrence of cracks can be prevented. The radius of curvature of this curved surface is preferably large, and the result of the calculation show that the radius of curvature of not less than 0.5 mm meets the purpose satisfactorily.

Figure 8:
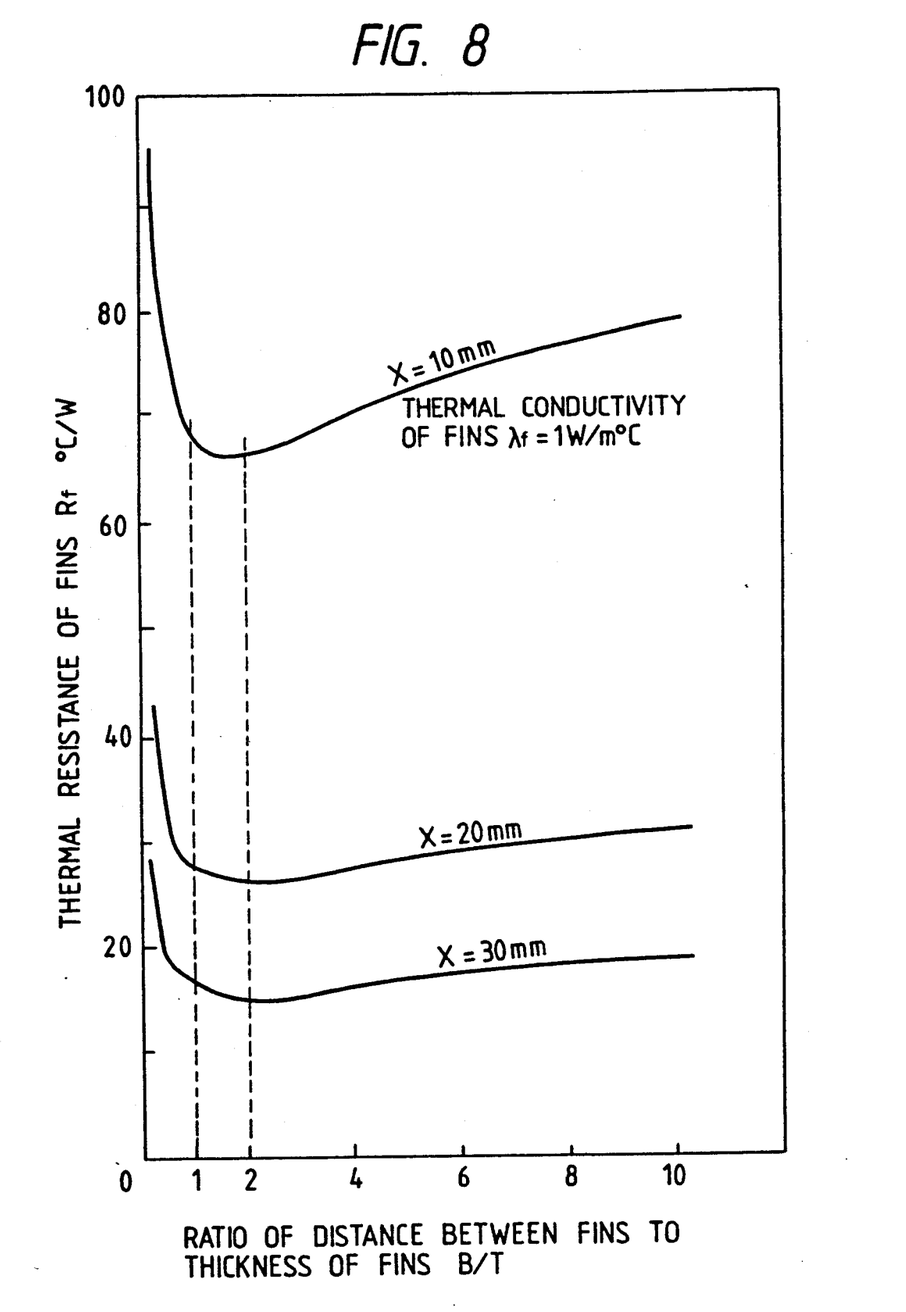
FIGS. 8 and 8A are characteristic diagrams showing the results of calculations concerning the relation between the thermal resistance of fins and the ratio of distance between fins to thickness of fins.
Figure 8A:
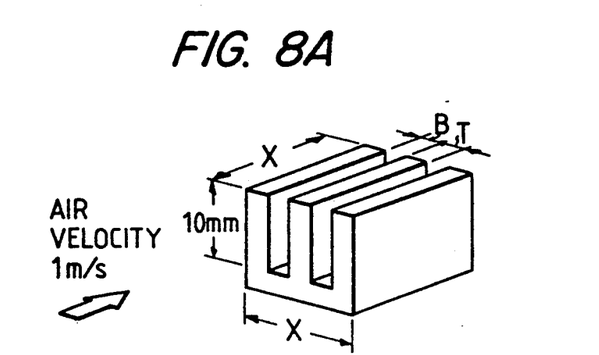

FIG. 8 shows the results of calculations concerning the relation between the thermal resistance of fins of a package using plastic fins and the ratio of the distance B between fins to the thickness T of fins. The calculations are made with the dimension X, which is shown in the drawing, varied to three different values. As will be understood from the drawing, the thermal resistance becomes minimal in any case where the ratio of the distance between fins to the thickness of fins is not less than 1 and not more than 2. This tendency does not substantially depend upon the thickness of fins. Therefore, in a package provided with fins according to the present invention, it is preferable to set the ratio of distance between fins (or fin segments) to the thickness of fins (or fin segments) to not less than 1 and not more than 2. When the thickness of a fin (or fin segments) varies with the height thereof, both the distance between fins and the thickness of fins to be used are determined at the portion of the fin in which the height thereat is $\frac{1}{2}$ of the total height of the fin.

Figure 9:
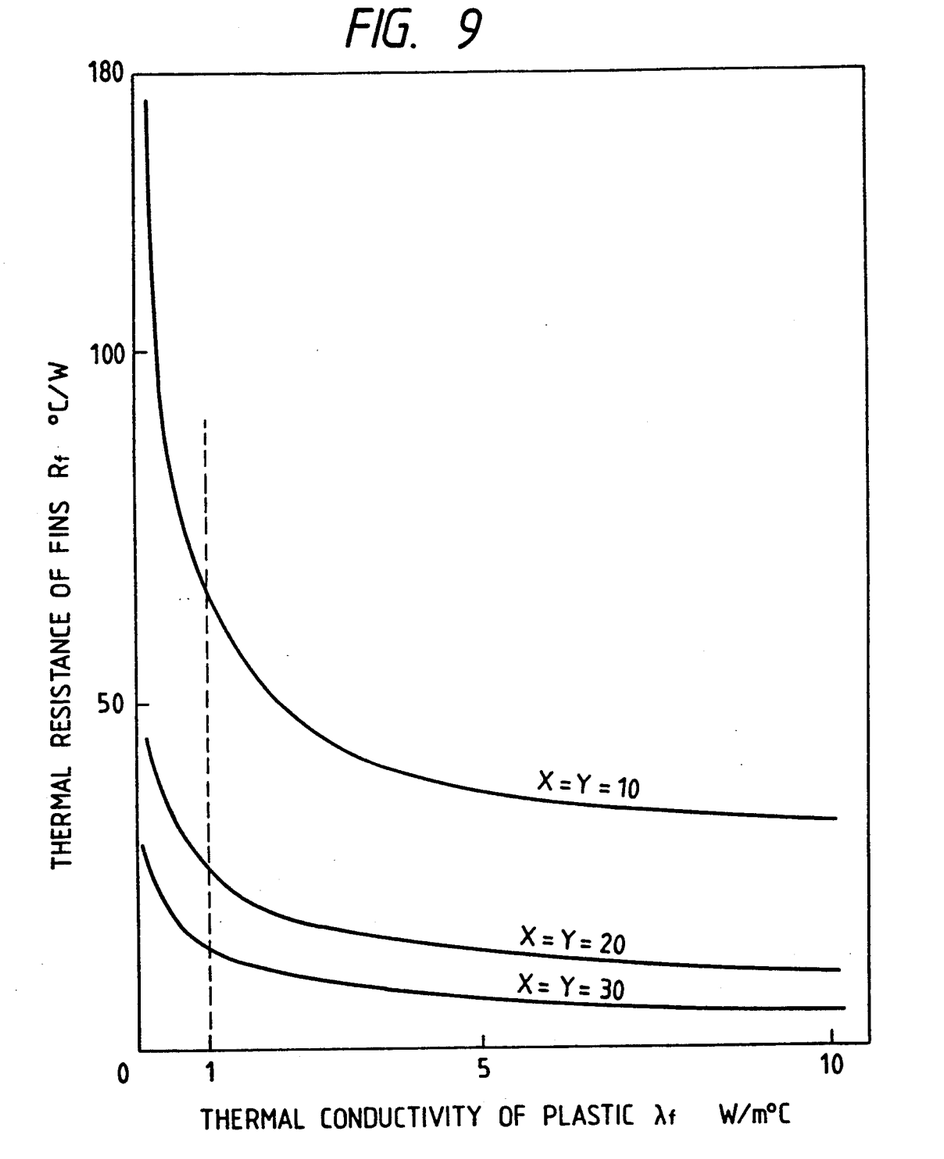
FIGS. 9 and 9A are characteristic diagrams showing the results of calculations concerning the relation between the thermal resistance of fins and thermal conductivity of fins.
Figure 9A:
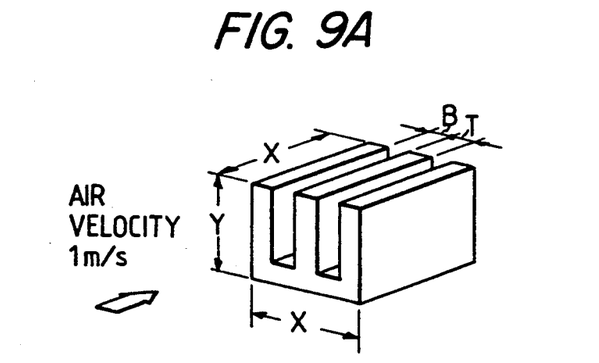

FIG. 9 shows the results of calculations concerning the relation between the thermal resistance Rf of fins and the thermal conductivity $\lambda f$ of the plastic used for the fins. The calculations are made with the dimensions X, Y, which are shown in the drawing, varied to three different values. As will be understood from the drawing, when $\lambda f$ becomes lower than 1 W/m° C., the thermal resistance Rf suddenly increases. Therefore, it is preferable that a plastic having a thermal conductivity of not lower than 1 W/m° C. is used for a package provided with plastic fins according to the present invention. When a plastic of a high thermal conductivity is used, the effect of the present invention increases since the thermal conductivity of an ordinary plastic to be transfer-molded is 0.5–0.8 W/m° C.

Figure 10:
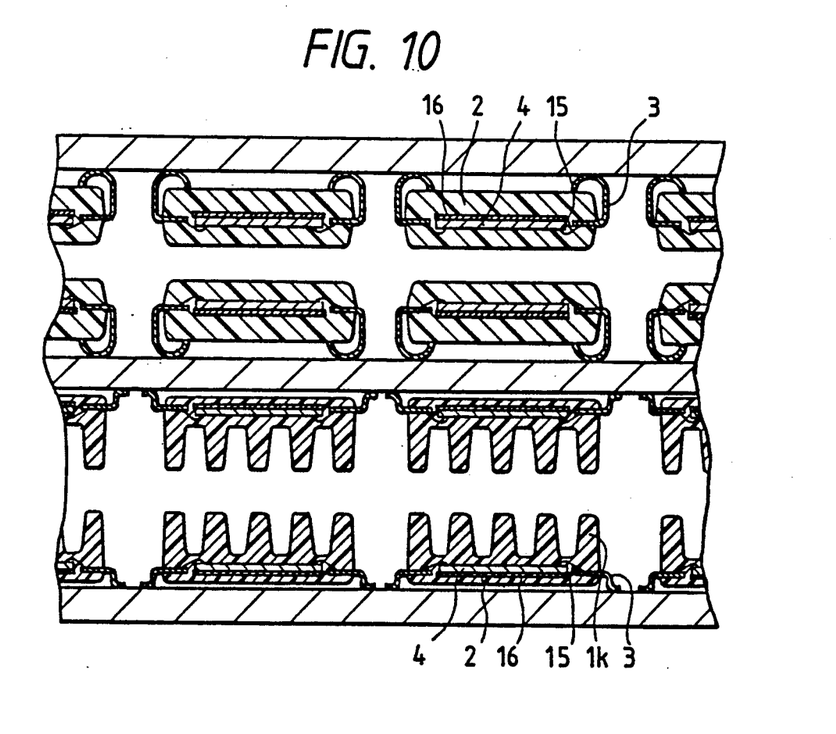
FIG. 10 is a sectional view of a structure mounted with packages, which is of a seventh embodiment of the present invention.

A sectional view illustrating a package mounting method constituting a seventh embodiment of the present invention is shown in FIG. 10. In order to easily compare a package according to the present invention with a conventional package in FIG. 10, the latter package is shown in the upper portion of the drawing, and the former in the lower portion thereof. In both of the packages, a chip 4 mounted on a metal plate 16 and leads 3 are connected electrically with wires 15, and the resultant product is plastic encapsulated to form a package body 2. In the package according to the present invention, plastic fins 1k are molded integrally with the package body 2.

In the package in this embodiment, the distance between the substrate surface and the end of a fin is set equal to that between the substrate surface of a conventional package and the opposite surface of the same package. The outside dimensions such as the width, length, etc. are the same as those of a conventional one. Therefore, the package in this embodiment has an advantage that a conventional substrate mounting apparatus can be used therefor as it is.

In the package of this embodiment, the thickness of the plastic on the lower side of the metal plate 16 on which the chip 4 is mounted is small, and the bond strength of the metal plate 16 and plastic is therefore very high. Accordingly, cracks, in the plastic which are ascribable to the soldering heat applied to the package body after the plastic has absorbed moisture, can be prevented.

In general, when a fin-carrying package is mounted in a wide space, the air flowing is kept away from the spaces among the fins, so that the radiation effect cannot be obtained. However, when packages are mounted so that the distance between the ends of the fins facing each other may be small as in this embodiment, the flow passage resistance of air in this portion increases. Consequently, the air flows smoothly among the fins as well, and the radiation effect is improved. In other words, it can be said that the package according to the present invention is more suitable to be applied to the high-density mounting of packages. It is preferable that the distance between the free ends of fins of opposed packages be set to a level not more than three times the distance between two adjacent fins.

The present invention is not, of course, limited to the above embodiments; it may be modified in various ways within the scope of the appended claims.

What is claimed is:

1. An encapsulated semiconductor device which includes an semiconductor chip, leads, and members for electrically connecting said semiconductor chip to said leads, and in which a part of said leads, said semiconductor chip and said connecting members are sealed with a plastic resin to form a package, is characterized in that parallel plate fins integrally formed with the sealing plastic resin are provided on at least one surface of said package, wherein said fins are disposed as an arrangement of plural groups of aligned fin segments, each group of fin segments is separated from an adjacent group of fin segments by a spacing.

2. A semiconductor device according to claim 1, wherein each of said fin segments is so shaped as to be tapered in an orthogonally outward direction from the package surface, and the angle between a side surface of each of said fins and said package surface is an obtuse angle selected from a range of not less than 95° and not more than 105°.

3. A semiconductor device according to claim 1, wherein root portions of the side surfaces of each of said fins are curved.

4. A semiconductor device according to claim 1, wherein said fin segments respectively extend in an orthogonal direction from said one surface of said package and each is wing-shaped in that it has one rounded edge at a first end thereof and at a second, opposing end thereof a sword-like edge with respect to a plan view of said one surface of said package.

5. A semiconductor device according to claim 1, wherein the ratio of the distance between adjacent fin segments at a height thereof, from the surface of said package, which is ½ of the total height of said fin segments to the thickness of said fin segments is not less than 1 and not more than 2.

6. A semiconductor device according to claim 1, wherein said package encapsulating plastic and the material of said fins are made of a plastic having a thermal conductivity of not lower than 1.0 V/m° C.

7. A semiconductor device according to claim 1, wherein a mark is put on said package surface.

8. A semiconductor device according to claim 1, wherein a mark is put on the free end of a fin segment.

9. An encapsulated semiconductor device which includes a semiconductor chip, leads, and members for electrically connecting said semiconductor chip to said leads, and in which a part of said leads, said semiconductor chip and said connecting members are sealed with a plastic resin to form a package, is characterized in that projections are formed out of the same plastic and on at least one surface of said package, wherein said projections are arranged on said at least one surface as plural groups of aligned fin segments, each group of aligned fin segments corresponds to a column direction of fin segments and each fin segment within a respective column corresponds to a row direction of said aligned fin segments, perpendicular to said column direction, and the direction of rows and columns of each and every one of said plural groups of aligned fin segments is respectively similar, and wherein the maximum length of each of said fin segments, corresponding to said row direction, is more than two times as large as the maximum thickness thereof.

10. A semiconductor device according to claim 9, wherein each of said fin segments is so shaped as to be tapered in an orthogonally outward direction from said package surface, and an angle between a side surface of each of said fin segments and said package surface is an obtuse angle selected from a range of not less than 95° and not more than 105°.

11. A semiconductor device according to claim 9, wherein root portions of the side surfaces of each of said fin segments are curved.

12. A semiconductor device according to claim 9, wherein the ratio of the distance between adjacent fin segments at a height thereof from the surface of said package which is ½ of the total height of said fin segments to the thickness of said fin segments is not less than 1 and not more than 2.

13. A semiconductor device according to claim 9, wherein said package encapsulating plastic and the material of said fin segments are made of a plastic having a thermal conductivity of not lower than 1.0 W/m° C.

14. A semiconductor device according to claim 9, wherein a mark is put on said package surface.

15. A semiconductor device according to claim 9, wherein a mark is put on the end of said fin.

16. A semiconductor device according to claim 1, wherein said plural groups of aligned fin segments include an array of groups of fin segments disposed in parallel on said at least one surface of the package, and wherein adjacent groups of fin segments respectively include different numbers of fins segments thereby effecting an alignment pattern of the individual fin segments of all groups in said array that is zig-zag.

17. A semiconductor device according to claim 16, wherein said fin segments respectively extend in an orthogonally outward direction from said one surface of said package and each is wing-shaped in that it has one round edge at a first end thereof, and at an opposing, second end thereof a sword-like edge with respect to a plan view of said one surface of said package.

18. A semiconductor device according to claim 16, wherein a ratio of the distance between adjacent fin segments at a height thereof from the surface of said package which is ½ of a total height of said fin segments to the thickness of said fin segments is not less than 1 and not more than 2.

19. A semiconductor device according to claim 16, wherein said package encapsulating plastic and the material of said fin segments consist of a plastic having a thermal conductivity of now lower than 1.0° C.

20. A semiconductor device according to claim 16, wherein a mark is put on said package surface.

21. A semiconductor device according to claim 16, wherein a mark is put on the end of said fin segment.

22. A packaging structure having substrates with electrical contacts and for mounting semiconductor devices on mounting surfaces of said substrates and being characterized as including:
   two substrates having mounting surfaces with electrical contacts and being arranged so that a mounting surface of one substrate is facing a mounting surface of the other one of said two substrates;
   wherein each of said two substrates is provided with one or more of said semiconductor devices at least on that mounting surface thereof facing a mounting surface of the other of said two substrates so that ones of said semiconductor devices mounted on one of said two substrates and facing other ones of said semiconductor devices mounted on the other of said two substrates are in alignment therewith;
   wherein each of said semiconductor devices is an encapsulated semiconductor device which comprises a semiconductor chip, leads, and members for electrically connecting said semiconductor chip to said leads, and in which a part of said leads, said semiconductor chip and said connecting members are sealed with a plastic resin to form a package body, and is characterized in that parallel plate fins integrally formed with the sealing plastic resin are provided on at least one surface of said package body, said fins are disposed as an arrangement of plural groups of aligned fin segments, and each group of fin segments is separated from an adjacent group of fin segments by a spacing; and
   wherein opposing semiconductor devices, mounted on different ones of said two substrates, are positioned on corresponding mounting surfaces such that fin segments of said semiconductor devices facing each other are respectively aligned.

23. A semiconductor device according to claim 1, wherein said plural groups of aligned fin segments are arrayed on said at least one surface of said package at regular spacings along a direction parallel to the elongated axis direction of said package, and wherein outer portions of said leads protrude outwardly from the elongated end surfaces of said package.

24. A semiconductor device according to claim 1, wherein said plural groups of aligned fin segments include at least three groups, each one thereof including plural fin segments parallelly aligned.

25. A semiconductor device according to claim 1, wherein said plural groups of aligned fin segments includes an equal number of fin segments, and within each group the individual fin segments thereof are respectively aligned with corresponding ones of remaining ones of said plural groups.

26. A semiconductor device according to claim 23, wherein said plural groups of aligned fin segments include an array of groups of fin segments disposed in parallel on said at least one surface of the package, and wherein adjacent groups of fin segments respectively include different numbers of fins segments thereby effecting an alignment pattern of the individual fin segments of all groups in said array that is zig-zag.

27. A packaging structure according to claim 22, wherein the distance between the ends of opposed fin segments protruding outwardly from the surface of devices that are facing each other is set to a value not more than three times of the distance between adjacent fin segments within a respective semiconductor device at a height thereof from the surface of said package body which is ½ of the total height of said fin segment.

28. A packaging structure having substrates with electrical contacts and for mounting semiconductor devices or mounting surfaces of said substrates and being characterized as including:
   two substrates having mounting surfaces with electrical contacts and being arranged so that a mounting surface of one substrate is facing a mounting surface of the other one of said two substrates;
   wherein each of said two substrates is provided with one or more of said semiconductor devices at least on that mounting surface thereof facing a mounting surface of the other of said two substrates so that ones of said semiconductor devices mounted on one of said two substrates and facing other ones of said semiconductor devices mounted on the other of said two substrates are in alignment therewith;
   wherein each of said semiconductor devices includes a semiconductor chip, leads, and members for electrically connecting said semiconductor chip to said leads, and in which a part of said leads, said semiconductor chip and said connecting members are sealed with a plastic resin to form a package body, and is characterized in that projections are formed out of the said plastic and on at least one surface of said package body, said projections are arranged on said at least one surface as plural groups of aligned fin segments, each group of aligned fin segments corresponds to a column direction of fin segments and each fin segment within a respective column corresponds to a row direction of said aligned fin segments, perpendicular to said column direction, and the direction of rows and columns of each and every one of said plural groups of aligned fin segments is respectively similar, and the maximum length of each of said fin segments, corresponding to said row direction, is more than two times as large as the maximum thickness thereof;
   and wherein opposing semiconductor devices, mounted on different ones of said two substrates, are positioned on corresponding mounting surfaces such that fin segments of said semiconductor devices facing each other are respectively aligned.

29. A packaging structure according to claim 28, wherein the distance between the ends of opposed fin segments protruding outwardly from the surface of devices that are facing each other is set to a value not more than three times of the distance between adjacent fin segments within a respective semiconductor device at a height thereof from the surface of said package body which is ½ of the total height of said fin segment.

* * * * *